United States Patent [19]
Kaminaga et al.

[11] Patent Number: 5,880,602
[45] Date of Patent: Mar. 9, 1999

[54] INPUT AND OUTPUT BUFFER CIRCUIT

[75] Inventors: Yasuo Kaminaga; Yoji Nishio, both of Hitachi, Japan

[73] Assignee: Hitachi, Ltd., Tokyo, Japan

[21] Appl. No.: 608,566

[22] Filed: Feb. 28, 1996

[30] Foreign Application Priority Data

Feb. 28, 1995 [JP] Japan .................................. 7-039683

[51] Int. Cl.⁶ ........................................... H03K 19/0185
[52] U.S. Cl. .................. 326/81; 326/58; 326/86
[58] Field of Search ............................ 326/80–81, 83, 326/57.58, 86, 27, 121; 327/333

[56] References Cited

U.S. PATENT DOCUMENTS

| | | |
|---|---|---|
| 5,160,855 | 11/1992 | Dobberpuhl . |
| 5,406,140 | 4/1995 | Wert t al. .................................. 326/81 |
| 5,450,025 | 9/1995 | Shay .......................................... 326/81 |
| 5,467,031 | 11/1995 | Nguyen et al. ........................... 326/81 |
| 5,543,733 | 8/1996 | Mattos et al. ............................. 326/81 |
| 5,646,550 | 7/1997 | Campbell, Jr. et al. .................. 326/81 |
| 5,661,414 | 8/1997 | Shigehara et al. ........................ 326/81 |

FOREIGN PATENT DOCUMENTS

| | | |
|---|---|---|
| A-4-329024 | 11/1992 | Japan . |
| A-5-227010 | 9/1993 | Japan . |

OTHER PUBLICATIONS

T. Nishihara et al., "IBM Moves to Sell LSIs to Outside Customers, . . . " Nikkei Micro–Devices, Oct., 1992, pp. 83–88.

*Primary Examiner*—Jon Santamauro
*Attorney, Agent, or Firm*—Antonelli, Terry, Stout & Kraus, LLP

[57] ABSTRACT

An input and output buffer circuit which is contained in a first circuit operated on a first power source of a first voltage level Vcc1 and is permitted to connect to a second circuit operated on a second power source of a second voltage level Vcc2 higher than the first voltage level Vcc1 including: a driver PMOS transistor with a CMOS gate; a PAD terminal serving as an input and output terminal; and means for controlling the potential of the N well of the driver PMOS transistor in such a manner that when the potential at the PAD terminal is less than Vcc1−Vth, wherein Vth is a threshold voltage of a MOS transistor contained between the driver PMOS transistor and the PAD terminal, the potential of the N well is set at the first voltage level Vcc1; when the potential at the PAD terminal is more than Vcc1+Vth, the potential of the N well is equated with the potential at the PAD terminal; and when the input and output buffer circuit is in the output mode the potential of the N well is switched to the first voltage level Vcc1, whereby the noise resistance and the latch-up resistance of the input and output buffer circuit are improved while preventing a path current flowing through the driver PMOS transistor.

11 Claims, 10 Drawing Sheets

INPUT AND OUTPUT BUFFER CIRCUIT

BACKGROUND OF THE INVENTION

The present invention relates to an input and output buffer circuit and, in particular, relates to an input and output buffer circuit through which other circuits and LSIs each operating at different voltage levels are permitted to be connected to each other.

LSIs and VLSIs constituted by Metal Oxide Film Semiconductors (MOSs) are being developed with a view toward a higher integration through micronization thereof and the use of a lower voltage power source; however, the application of systems using these LSIs and VLSIs is not limited to a system which closes with only a single lower voltage source. Therefore, there still remains a demand for an input and output buffer circuit through which LSIs, each operating at different voltage levels, are permitted to be connected to each other. Thus, an input and output buffer circuit which meets the requirements for a hybrid system operating at different voltage levels and which includes some of the counter measures therefor has been proposed.

An example of such input and output buffer circuits is disclosed in a paper by Tetsuhiro Nishihara et al. "IBM moves to sell LSIs to outside customers, and discloses gate-array technology, a core technology which is to be employed for note type personal computer operating at 3V power source" (NIKKEI MICRODEVICES, October, 1992, pp. 83–88), and a circuit disclosed therein is illustrated in FIG. 16.

The structure and the operation of the circuit shown in FIG. 16 will be explained. In FIG. 16, Q1 and Q2 form an input and output control circuit which is constituted by a two input NAND circuit, a two input NOR circuit and an inverter, and is controlled by an output enable signal OE and a data output signal DOUT. QP3 and QN3 are respectively driver PWMOS and NMOS transistors which constitute an output driver unit; while, Q3 is an input buffer, and DN1 and DP1 operate respectively as electrostatic destruction countermeasuring devices, with DN1 being a junction type diode and DP1 being a punch through type diode. The present input and output buffer circuit is designed to be operated at a power source voltage of Vcc1 (3.3V).

A first problem in conventional input and output buffer circuits occurs during the input mode thereof and when a high level voltage signal of 5.0V from another input and output buffer circuit, which is designed to be operated at a higher power source voltage of 5.0V, is directly applied to a PAD for an input and output buffer circuit, which is designed to be operated at a lower power source voltage of 3.3V. Namely, through a parasitic diode formed between the N well node NW, serving also as the substrate of the driver PMOS transistor QP3, and the source thereof, a current path is formed because of the potential difference between the PAD at 5.0V and Vcc1 (3.3V). In the FIG. 16 circuit, as a counter-measure for this problem, a PMOS transistor QP4 is turned off when a higher level signal potential of 5.0V is applied to the PAD terminal, and the potential of the N well node NW of the driver PMOS transistor QP3 is caused to float to prevent formation of the current path.

A second problem in the conventional input and output buffer circuits during the input mode is due to the fact that, because the potentials of 3.3V and 5.0V are respectively applied to the gate and the source connected to the PAD of the driver PMOS transistor QP3, the driver PMOS transistor QP3 cannot be turned off, thereby creating a current path therethrough. In the FIG. 16 circuit, a PMOS transistor QP2 is introduced which is designed to turn on when a high level potential signal of 5.0V is applied to the PAD, whereby the potential of the gate of the QP3 is made equal to the PAD potential of 5.0V connected to the source of the QP3 to avoid the formation of the current path.

Further, in order to prevent the potential of 5.0V at the gate of the QP3 from being applied to the output side of the two input NAND circuit Q1 via the newly introduced PMOS transistor QP2, a NMOS transistor QN1 is further provided. Still further, in order to prevent the potential at the gate of the PMOS transistor QP3 from dropping to $Vcc1-V_{thQN1}$ (wherein $V_{thQN1}$ is the threshold voltage of the NMOS transistor QN1) when the two input NAND circuit Q1 outputs the signal of high potential level of 3.3V, because of the provision of the NMOS transistor QN1, a transfer gate connected to PMOS transistor QP1 is further provided which is connected in parallel with the NMOS transistor QN1.

A third problem in the conventional input and output buffer circuits results because a PN junction type diode serving as an electrostatic destruction protecting device at the power source side is connected to Vcc1 (3.3V) at the cathode thereof, so that a current path is also formed due to the potential difference with the high potential level of 5.0V at the PAD. In the FIG. 16 circuit, as a counter-measure to this problem, formation of a current path is prevented through introduction of the punch-through type diode DP1.

A fourth problem in the conventional input and output buffer circuits is due to the fact that the signal of high potential level of 5.0V appearing at the PAD during the input mode thereof is also applied to the drain of the driver NMOS transistor QN3. In the FIG. 16 circuit, this problem is solved through the provision of a NMOS transistor QN2 which drops the potential applied to the driver NMOS transistor QN3 down to $3.3V-V_{thQN2}$ (wherein $V_{thQN2}$ is the threshold voltage of the NMOS transistor QN2) to ensure protection for the QN3 against an excess voltage application.

A fifth problem in the conventional input and output buffer circuits is due to the fact that the signal of high potential level of 5.0V appearing at the PAD during the input mode thereof is also applied to the gate of the input buffer Q3. In the FIG. 16 circuit, this problem is solved through the provision of a NMOS transistor QN4 which drops the potential applied to the gate of the input buffer Q3 down to $3.3V-V_{thQN4}$ (wherein $V_{thQN4}$ is the threshold voltage of the NMOS transistor QN4) to ensure protection for the input buffer Q3 against an excess voltage application.

In the FIG. 16 circuit, the potential of the N well node serving as the substrate of the driver PMOS transistor QP3 is determined by the PMOS transistor QP4. Namely, when the potential at the PAD terminal is less than $Vcc1-V_{thQP4}$, the PMOS transistor QP4 is turned on and the potential of the N well node NW is fixed at Vcc1=3.3V, and when the potential of the PAD terminal is other than the above, for example, is larger than $Vcc1-V_{thQP4}$, the PMOS transistor QP4 is turned off and the potential of the N well node is set to a floating level.

Another example of such input and output buffer circuits, which is disclosed in JP-A-4-329024(1992), is illustrated in FIG. 17. Only those countermeasures which are different from those of the FIG. 16 circuit for solving the problems in the conventional input and output buffer circuits through which other circuits, each operating at different power source voltage levels, are permitted to be connected to each other, will be explained. The N well node NW, serving as the substrate of the driver PMOS transistor receives the maximum potential of Vcc2=5.0V at the PAD terminal to cancel out the potential difference between the N well node NW and the drain of the driver PMOS transistor QP3 connected to the PAD terminal, so as to thereby avoid the formation of a current path. The FIG. 17 circuit uses two power sources of different voltage levels. Further, when the driver PMOS transistor QP3 is turned on, a voltage of 5.0V is applied between the gate and the N well node NW of the PMOS transistor QP3, which necessitates an increase in the withstanding voltage therebetween, such as by thickening the gate oxide film therein.

Still another example of such input and output buffer circuits, as disclosed in JP-A-5-227010(1993), which corresponds to U.S. Pat. No. 5,160,855, is illustrated in FIG. 18. The gate potential control by the voltage floating gate (VFG) circuit in FIG. 18 is equivalent to that shown in the FIG. 16 circuit, which makes the gate potential of the driver PMOS transistor QP3 equal to the source potential thereof connected to the PAD when the PAD receives the potential of 5.0V, so as to prevent the generation of a potential difference between the gate and the source thereof, prevent the turning on thereof and prevent the formation of a current path therethrough. Further, the potential control of the N well node NW serving as the substrate of the PMOS transistor QP3 is performed by a voltage floating well (VFW) circuit constituted by four PMOS transistors QP45, QP46, QP55 and QP56. The VFW circuit operates in such a manner that, when the PAD terminal potential $\geq$ Vcc1+$V_{thQP3}$, the PMOS transistor QP55 is turned on, the other PMOS transistors QP45, QP46 and QP56 are turned off and the potential of the N well node NW is made equal to the potential at the PAD terminal; when the PAD terminal potential $\leq$ Vcc1-$V_{thQP3}$, the PMOS transistor QP45 is turned on and the other PMOS transistors QP55, QP56 and QP46 are turned off and the potential of the N well node NW is rendered to Vcc1 of 3.3V; and when the PAD terminal potential is in the range of Vcc1-$V_{thQP3}$~Vcc1+$V_{thQP3}$, the potential of the N well node NW is placed in the floating state.

The circuit using the two power sources of different potential levels as shown in FIG. 17 requires a more complex circuit structure than that using a power source of a single potential level. Further, during the output mode in the other two circuits shown in FIG. 16 and FIG. 18, and when the PAD terminal potential is at 3.3V, the potential at the N well node NW is placed in a floating state. For this reason, the parasitic diode in the driver PMOS transistor QP3 works as a coupling capacitor, and therefore, in particular, during the output mode, the potential of the N well node is affected by the change in the operating condition of the driver PMOS transistor QP3. Accordingly, the parasitic diode formed between the source connected to Vcc1 and the N well node NW of the driver PMOS transistor QP3 may sometimes be forward biased, which reduces the noise resistance and the latch-up resistance thereof. On the other hand, when the potential of the N well node NW remains high, the parasitic diode is reverse biased, which increases the threshold voltage $V_{thQP3}$ due to a substrate biasing effect, to thereby reduce the current driving capability of the PMOS transistor QP3 and deteriorate the operation speed thereof.

SUMMARY OF THE INVENTION

An object of the present invention is to provide an input and output buffer circuit through which other circuits, each operating at different power source voltage levels, are permitted to be connected to each other, and which buffer circuit prevents formation of a path current flowing through a driver PMOS transistor contained therein and requires no additional excess voltage withstanding capacity for the driver PMOS transistor; and, more specifically, the object of the invention is to provide such an input and output buffer circuit having a desired noise resistance, a desired latch-up resistance and a smaller turning on operation delay.

In the input and output buffer circuit according to the present invention, in particular, during the output mode thereof in which the driver PMOS transistor is activated, the potential of the N well node of a driver PMOS transistor contained therein is controlled in such a manner that even when the potential of the PAD terminal connected to the source of the driver PMOS transistor is at the normal value of Vcc1, the potential of Vcc1 is applied to the N well node of the driver PMOS transistor. In other words, the driver PMOS transistor in the input and output buffer circuit is constituted in such a manner that the source of the driver PMOS transistor is connected to Vcc1, the drain thereof is adapted to be connected to the N well node thereof and the gate thereof is adapted to be connected to a signal line from an input and output control circuit for the input and output buffer circuit.

With the above features, during the output mode in which the driver PMOS transistor is activated, the potential of the N well node is fixed at Vcc1, other than a floating potential, even at the time when the potential at the PAD terminal is at Vcc1; therefore, the above indicated noise resistance and the latch-up resistance for the input and, output buffer circuit according to the present invention are improved.

DETAILED DESCRIPTION OF THE EMBODIMENTS

Figure 1:
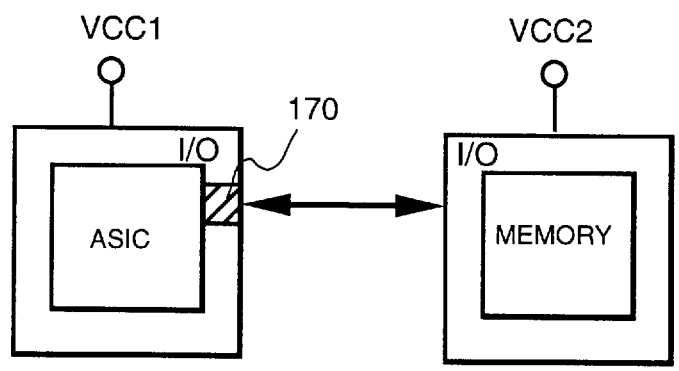
FIG. 1 is a schematic block diagram of a system in which input and output buffer circuits according to the present invention are used.

FIG. 1 shows an example of a system in which an input and output (I/O) buffer circuit according to the present invention is used. For example, when an application specific integrated circuit (ASIC) large scale integrated (LSI) chip, on which an I/O buffer circuit 170 according to the present invention is mounted, is designed to operate with a supply power source voltage Vcc1 of 3.3V, and to drive a central processing unit (CPU) and logic gates within the ASIC and the I/O buffer circuit 170 at the supply power source voltage of 3.3V, and when the components contained therein are also designed to withstand the supply power source voltage of 3.3V, the ASICLSI chip is permitted to be connected directly to another LSI chip serving as, for example, a memory, which may be driven with a different power source of a higher voltage Vcc2 or the same voltage level, to constitute a unit system by means of the I/O buffer circuit 170 according to the present invention.

An embodiment of the I/O buffer circuits according to the present invention will be hereinbelow explained with reference to FIG. 2.

Q1 and Q2 are respectively a two input NAND circuit and an inverter connected to a two input NOR circuit forming an input and output control circuit QP3 and QN3 are respectively a driver PMOS transistor and a driver NMOS transistor; Q3 is an input buffer; QN2 is a NMOS transistor for protecting the driver NMOS transistor QN3 against an excess voltage application; QN4 is a NMOS transistor for protecting the input buffer Q3 against an excess voltage application; DN1 and DP1 are devices used for protecting against an electrostatic destruction; QN1 and QP1 are respectively a NMOS transistor and a PMOS transistor which protect the two input NAND circuit Q1 against an excess voltage application and ensure the input signal level for the driver PMOS transistor QP3; QP2 is a PMOS transistor which prevents a path current from flowing through the driver PMOS transistor QP3; QP4, QP5, QP6 and QP21 are respectively PMOS transistors for controlling the potential of the N well of the driver PMOS transistor QP3; and QP41 and QP51 are respectively PMOS transistors used for clamping the potential of the N well of the driver PMOS transistor QP3.

The operation of the FIG. 2 circuit will be explained hereinbelow.

During the input mode of the I/O buffer circuit in which the I/O buffer circuit shows a high impedance, an input signal is applied to the I/O buffer circuit from an I/O buffer circuit of another LSI connected thereto via a PAD terminal.

Figure 2:
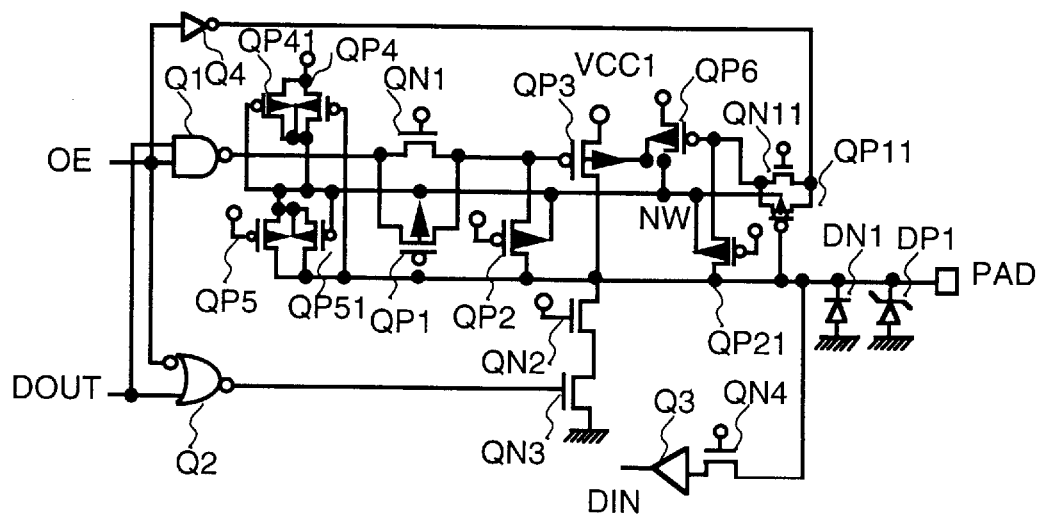
FIG. 2 is a circuit diagram of one embodiment of input and output buffer circuits according to the present invention.

When the driving power source voltage of the connected other I/O buffer circuit is at Vcc2, which is different from and higher than Vcc1 with which the FIG. 2 circuit, is operated, a high voltage is applied to the PAD terminal. Although Vcc1 and Vcc2 can take any voltage values, it is assumed hereinbelow that Vcc1 is 3.3V and Vcc2 is 5.0V for the sake of convenience in the following explanation.

When a signal such as "H"=5.0V, "H"=3.3V and "L"=0V is inputted to the PAD terminal, the signal is transmitted to an input terminal DIN via the input buffer Q3. In this instance, in order to protect a MOS transistor in the input buffer Q3, which is designed to be operated at 3.3V, against an excess voltage application, in other words, in order to prevent application of the higher voltage of 5.0V at the input gate of the input buffer Q3 serving as the input terminal thereof, the source-drain path of the NMOS transistor QN4 is connected in series with the input gate terminal of the input buffer Q3 so that the potential at the input gate is reduced to $3.3V - V_{thQN4}$. During this input mode, because of the signal OE="L" from the input and output control circuit, the gate of the driver PMOS transistor QP3 is rendered "H" and the gate of the driver NMOS transistor QN3 is rendered "L"; as a result, both the PMOS and NMOS transistors QP3 and QN3 are in a turned off condition. In order to prevent a current path from being formed in the driver PMOS transistor QP3 caused by a potential difference at this moment between the gate and drain (or source) thereof, which correspond to the gate and the PAD, the PMOS transistor QP2 is introduced, which is designed to be turned on only when the potential at the PAD terminal is more than $Vcc1 + V_{thQP2}$, so that the potential of the gate of the driver PMOS transistor QP3 is made equal to that of the PAD terminal. The NMOS transistor QN1 operates so as not to apply the high voltage of 5.0V at the drain side of the PMOS transistor QP2 to the two input NAND circuit Q1. The PMOS transistor QP1 is introduced so as to prevent the driver PMOS transistor QP3 from being turned on because the output signal "H"=3.3V from the two input NAND circuit Q1, during the output mode, at the gate of the driver PMOS transistor QP3, is dropped down to $3.3V_{31} v_{thQN1}$, due to the introduction of the NMOS transistor QP1.

Further, in order to prevent a path current from flowing in the driver PMOS transistor QP3 caused by forward biasing of a parasitic diode formed between the N well, also serving as the substrate thereof, and the PAD terminal, possibly assuming the high voltage of 5.0V by means of a potential difference between 5.0V and 3.3V, the potential of the N well node NW of the driver PMOS transistor QP3 is controlled in the manner of a moving potential N well.

Although the normal value at the PAD terminal is one of three values 0V, 3.3V and 5.0V, the potential at the PAD terminal can take any value between 0V~3.3V~5.0V. In the present embodiment, when the PAD terminal potential $\leq Vcc1 - V_{thQP4}$, the PMOS transistor QP4 is turned on and the potential of the N well NW assumes Vcc1; when PAD terminal potential $\geq Vcc1 + V_{thQP5}$, the PMOS transistor QP5 is turned on and a potential $(Vcc1 + V_{thQP5} \sim Vcc2)$ equivalent to that at the PAD terminal is applied to the N well node NW of the driver PMOS transistor QP3; and when the potential at the PAD terminal is in the range of $Vcc1 - V_{thQP4} \sim Vcc1 \sim Vcc1 + V_{thQP5}$, the PMOS transistors QP41 and QP51 are activated to place the N well node NW of the driver PMOS transistor QP3 into a floating state with a clamp, which ensures potential levels of potential $Vcc1 - V_{thQP4}$ and a PAD terminal potential $- V_{thQP51}$, i.e. $Vcc1 - V_{thQP51} \sim Vcc1$.

On the other hand, when the I/O buffer circuit is in the output mode, an enable signal "H" is applied at the terminal OE of the input and output control circuit. When outputting a "H" level signal at the PAD terminal, the "H" level signal is applied at the data output signal terminal DOUT; thus, the two input NAND circuit Q1 outputs an "L" level signal, which turns on the driver PMOS transistor QP3, and the two input NOR circuit Q2 outputs an "L" level signal, which turns off the driver NMOS transistor QN3. As a result, the outputting PAD terminal is placed at the "H" level potential (Vcc1). Further, when outputting the "L" level signal at the PAD terminal, the "L" level signal is applied to the data output signal terminal DOUT, thus the two input NAND circuit Q1 outputs a "H" level signal, which turns off the driver PMOS transistor QP3, and the two input NOR circuit Q2 outputs a "H" level signal, which turns on the driver NMOS transistor QN3; as a result, the outputting PAD terminal is placed at the "L" level potential (0V).

In the present embodiment, the potential clamping PMOS transistors QP41 and QP51 can be eliminated, because the PMOS transistor QP3 inherently includes a parasitic diode. During the output mode, in such a modification in which the driver PMOS and NMOS transistors QP3 and QN3 are activated, the PMOS transistor QP6 is adapted to be controlled by a signal obtained by inverting the enable signal from the terminal OE in the input and output control circuit via the inverter Q4, and when the enable signal at the terminal OE is "H", the driver PMOS transistor QP3 is turned on so that Vcc1 is applied to the N well node NW thereof. Namely, during the output mode in which the potential at the PAD terminal may assume one value among 0V~3.3V, the N well node NW always receives the constant potential Vcc1 of 3.3V and the floating state encountered when the PAD terminal assumes the normal voltage value 3.3V is eliminated. QN11 and QP11 are MOS transistors which ensure the same operating voltage level as the MOS transistors QN1 and QP1 and prevent the flowing of a path current, and QP21 is a PMOS transistor which ensures the same operating voltage level as the PMOS transistor QP2 and prevents the flowing of a path current.

As a further modification, the PMOS transistor QP11 can be eliminated, if during the input mode and when the PAD terminal potential≦Vcc1+Vth, the PMOS transistor QP6 is designed to be turned on.

The NMOS transistor QN2 is provided so that the maximum potential 5.0V appearing at the PAD terminal is not applied to the drain of the NMOS transistor QN3 for protecting the same against an excess voltage application. The devices DN1, DP1 are devices used for a countermeasure against electrostatic destruction and the device DN1 makes use of a PN junction type diode and DP1 makes use of a punch-through type zener diode.

In the FIG. 2 circuit, the PMOS transistors QP5 and QP51 can be eliminated. In such a modification, although, when the potential at the PAD terminal is in the range of Vcc1+Vth~Vcc2, the potential of the N well node NW of the driver PMOS transistor QP3 is placed in a floating potential state, during the active condition of the driver MOS transistors QP3 and QN3, the potential at the N well node NW is maintained at a constant voltage Vcc1 of 3.3V.

Figure 3:
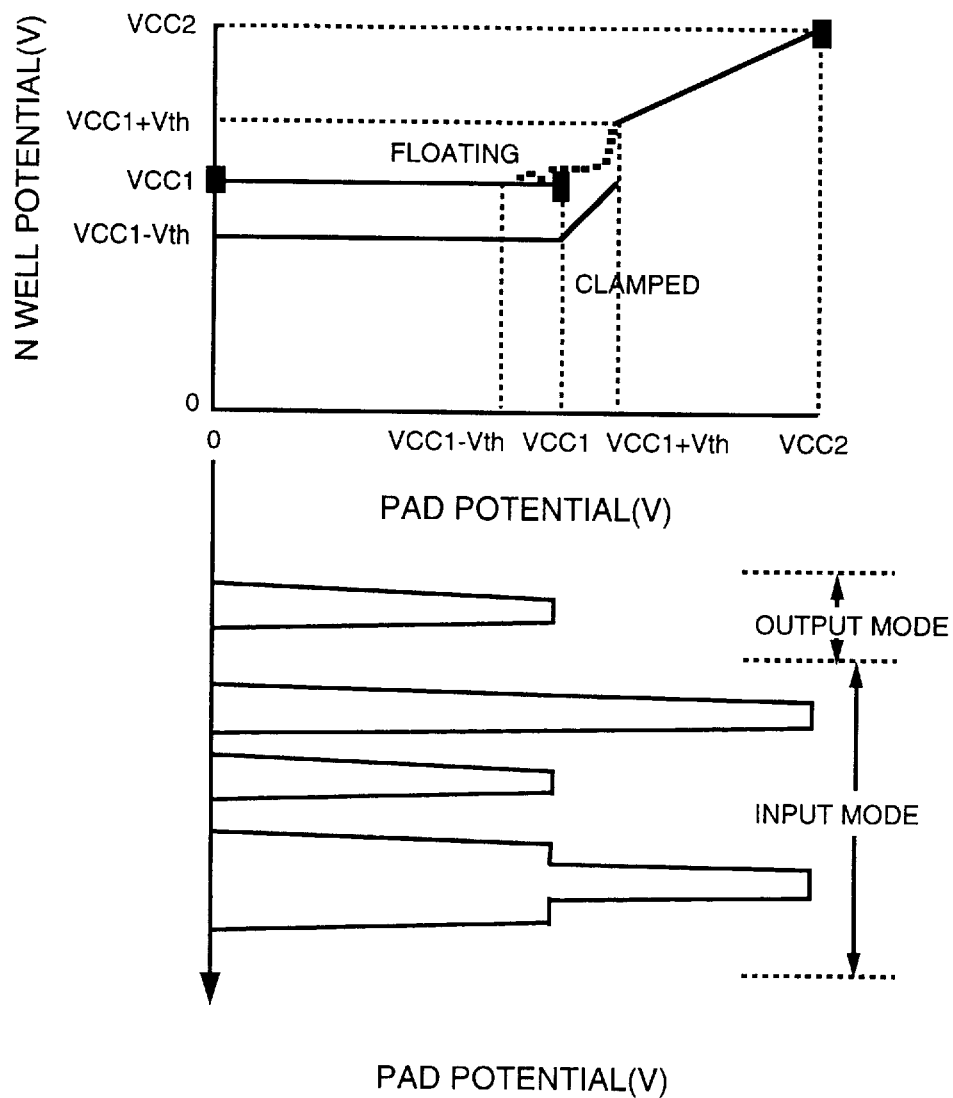
FIG. 3 is a diagram for explaining the operation of the input and output buffer circuit as shown in FIG. 2.

FIG. 3 shows a relation between the PAD potential and the N well potential of the driver PMOS transistor QP3 and potential waveforms which appear at the PAD terminal as observed in the FIG. 2 circuit. In the potential range 0V~Vcc2, the three normal potential values are 0V, Vcc1 and Vcc2.

In the range of the PAD potential≦Vcc1−Vth, the potential of the N well is fixed at Vcc1; in the range of the PAD potential≧Vcc1+Vth, the potential of the N well is made equal to the PAD potential; and in the range of Vcc1−Vth~Vcc1+Vth, although the potential of the N well is placed in a floating state with clamping, in the output mode in which the driver MOS transistors are activated, the potential of theN well is fixed at a constant voltage of Vcc1 (3.3V).

Figure 4:
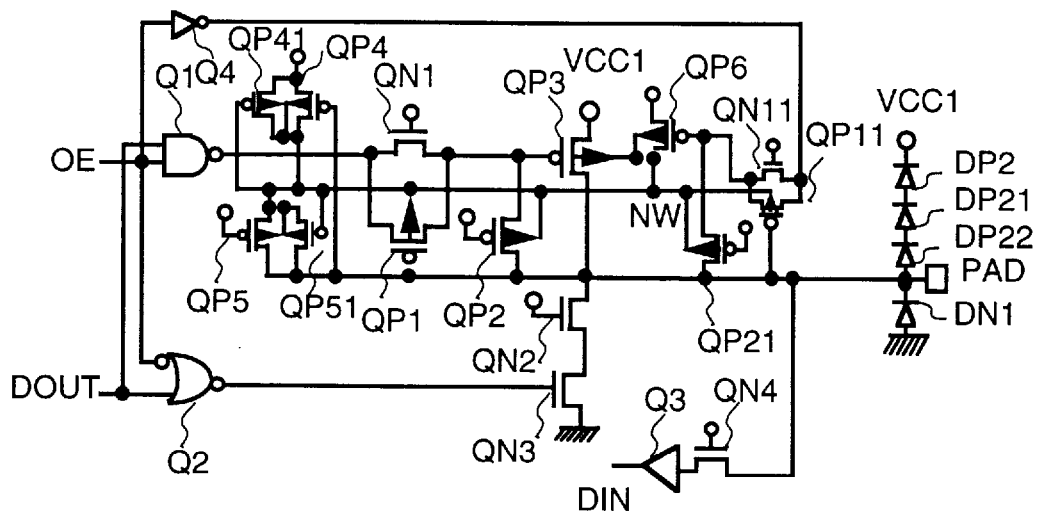
FIG. 4 is a schematic circuit diagram of a modification of the embodiment as shown in FIG. 2.

FIG. 4 is a modification of the FIG. 2 embodiment. The elements which perform the same functions and operations as the elements in the FIG. 2 embodiment are designated by the same reference numerals, and only the differences in the FIG. 4 embodiment from the FIG. 2 embodiment will be explained. In the present modification, instead of using a punch-through type zener diode, the devices for countermeasuring electrostatic destruction DP2, DP21 and DP22 are constituted by PN junction type diodes or PMOS transistors. Namely, a plurality of such devices are connected in series so as to prevent current flow toward Vcc1 even if the high potential of 5.0V is applied at the PAD terminal.

Figure 5:
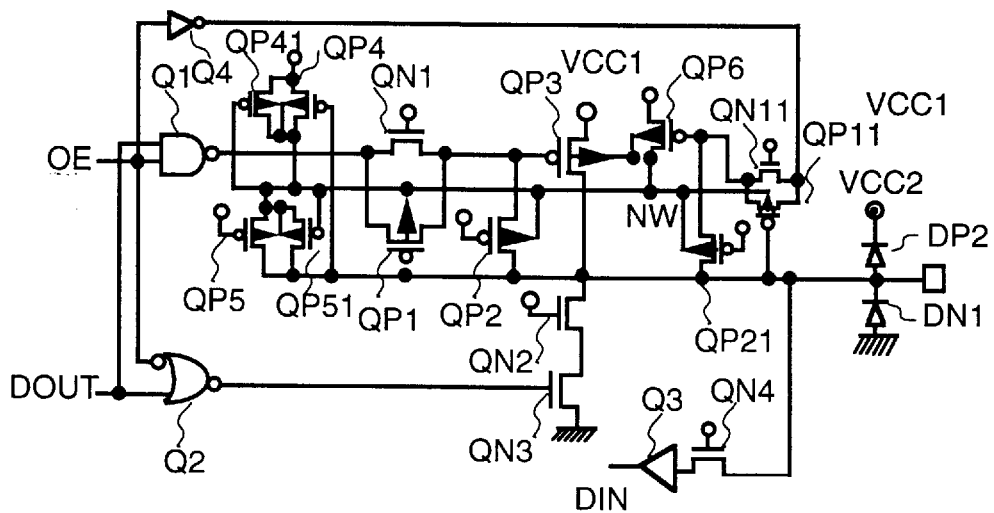
FIG. 5 is a schematic circuit diagram of another modification of the embodiment as shown in FIG. 2.

FIG. 5 shows another modification of the FIG. 2 embodiment. The elements which perform the same functions and operations as the elements in the FIG. 2 embodiment are designated by the same reference numerals, and only the differences in the FIG. 5 embodiment from the FIG. 2 embodiment will be explained. In the present modification, instead of using a punch-through type zener diode, the device for countermeasuring electrostatic destruction DP2 is constituted by a single PN junction type diode or a single PMOS transistor. In the present modification, a power source voltage of Vcc2 is required for the device for countermeasuring electrostatic destruction DP2.

Figure 6:
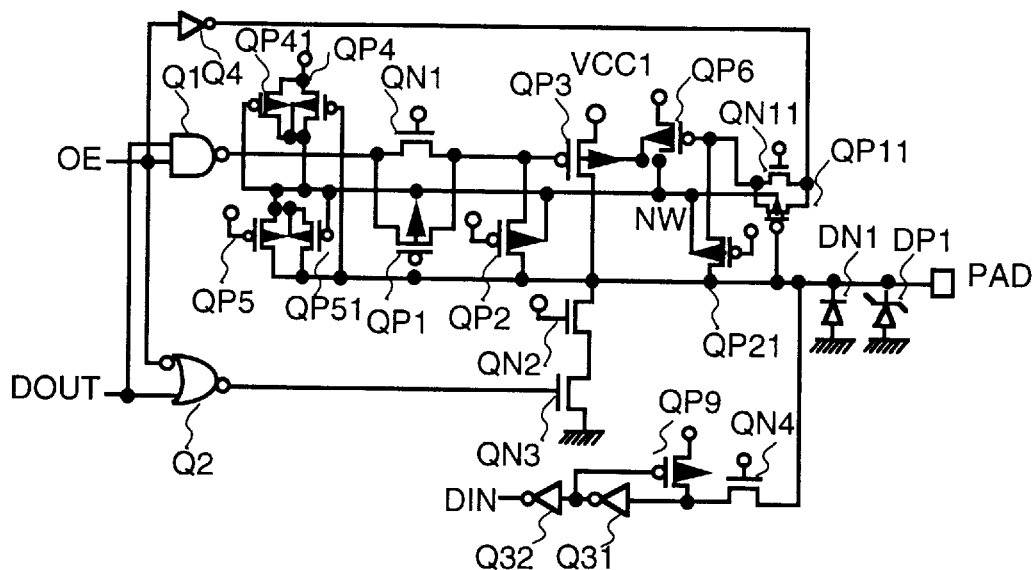
FIG. 6 is a schematic circuit diagram of still another modification of the embodiment as shown in FIG. 2.

FIG. 6 shows still another modification of the FIG. 2 embodiment. The elements which perform the same functions and operations as the elements in the FIG. 2 embodiment are designated by the same reference numerals, and only the differences in the FIG. 6 embodiment from the FIG. 2 embodiment will be explained. In the present modification, when the potential at the drain side of the NMOS transistor QN4 drops to "H"=Vcc1−$V_{th_{QN4}}$ during the input mode and a leakage current through a transistor for the input buffer Q31 cannot be neglected, steps are taken to pull up the potential at the input terminal of the input buffer Q31. For example, a PMOS transistor QP9 is provided so that the potential at the input terminal of the input buffer Q31 is pulled up by the fed-back signal from the output of the input buffer Q31 to thereby prevent the flow of leakage current. Q32 in the present modification is also an input buffer constituting a part of the input buffer circuit Q3. The measure according to the present modification can be applied to the previous embodiment and modifications as well as embodiments and modifications according to the present invention which will be explained hereinbelow.

Figure 7:
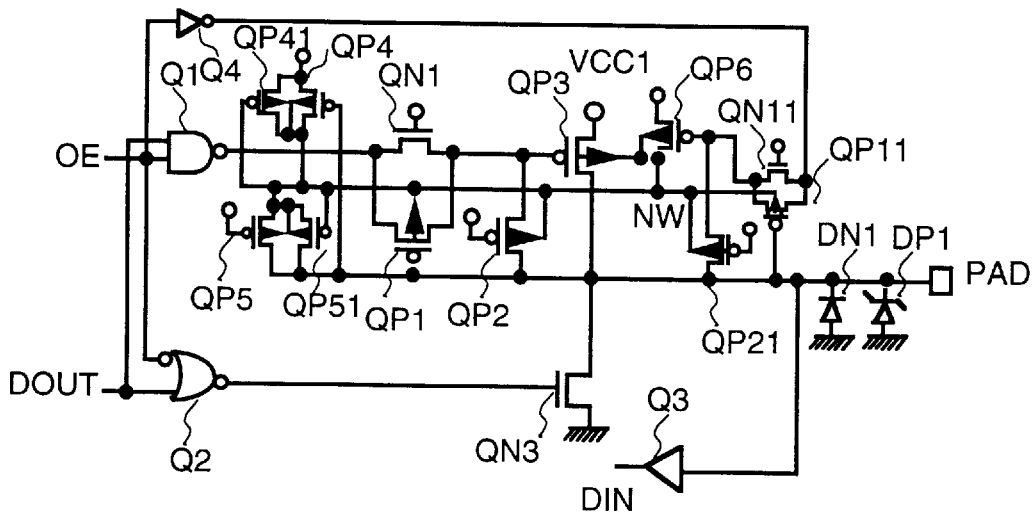
FIG. 7 is a schematic circuit diagram of a further modification of the embodiment as shown in FIG. 2.

FIG. 7 shows a further modification of the FIG. 2 embodiment. The elements which perform the same functions and operations at the elements in the FIG. 2 embodiment are designated by the same reference numerals, and only the differences in the FIG. 7 embodiment from the FIG. 2 embodiment will be explained. In the present modification, the NMOS transistors QN2 and QN4 are eliminated, which is acceptable if the driver NMOS transistor QN3 and the input buffer Q3 can withstand the application of Vcc2 at the PAD terminal by use of some structural measures, i.e. circuit structure or semiconductor manufacturing process.

Figure 8:
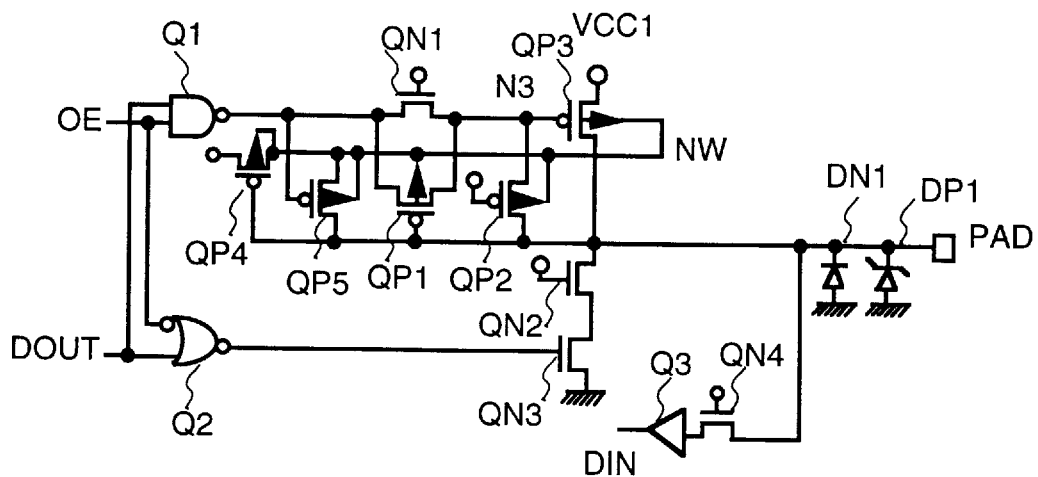
FIG. 8 is a schematic circuit diagram of another embodiment of input and output buffer circuits according to the present invention.

FIG. 8 shows another embodiment according to the present invention. The elements which perform the same functions and operations as the elements in the FIG. 2 embodiment are designated by the same reference numerals, and only the differences in the FIG. 8 embodiment from the FIG. 2 embodiment will be explained. In the present embodiment, the operation performed by the PMOS transistors QP6 and QP5 in the FIG. 2 embodiment, wherein during the output mode the potential at the N well of the driver PMOS transistor QP3 is kept at Vcc1 and when the PAD potential≧Vcc1+Vth, the potential of the N well is equated with that at the PAD terminal, is designed to be performed by the operation of a single PMOS transistor QP5. Namely, the gate signal for the PMOS transistor QP5 is supplied from the output of the two input NAND circuit Q1 in the input and output control circuit, such that during the input mode "H"=3.3V is applied at the gate terminal and during the output mode, when the "H" level signal is outputted, "L"=0V is applied at the gate terminal. As a result, the single PMOS transistor QP5 in the present embodiment performs the operation which is performed by the two PMOS transistors QP5 and QP6 in the FIG. 2 embodiment. Further, the operation timings of the PMOS transistors QP4 and QP5 can be adjusted in such a manner as to delay the gate signal for the PMOS transistor QP5 so that temporarily a potential reduction of the N well experienced during a changing-over from the input mode to the output mode is prevented.

Figure 9:
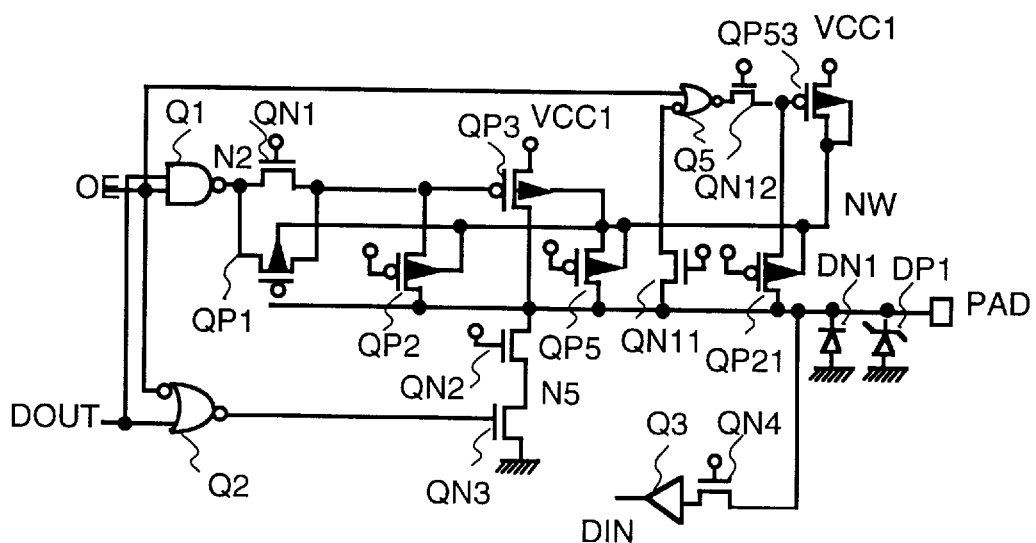
FIG. 9 is a schematic circuit diagram of still another embodiment of input and output buffer circuits according to the present invention.

FIG. 9 shows still another embodiment according to the present invention. The elements which perform the same functions and operations as the elements in the FIG. 8 embodiment are designated by the same reference numerals, 5 and only the differences in the FIG. 9 embodiment from the FIG. 8 embodiment will be explained. In the present embodiment, the potential control operation of the N well of the PMOS transistor QP3 in FIG. 8 is performed by the PMOS transistors QP5 and QP53. Namely, when the OE signal and "L" level signal at the PAD terminal are applied to the gate of the PMOS transistor QP53 via a two input NOR circuit Q5, the potential at the N well is kept at Vcc1 during the output mode and when the PAD terminal potential≦Vcc1−Vth. The modifications of the devices for countermeasuring electrostatic destruction, as explained in connection with FIG. 4 and FIG. 5, the pulling up of the "H" level potential by means of the PMOS transistor QP9 as explained in connection with FIG. 6, and the idea of lowering the power source voltages, for example, down to Vcc1=2.5 and Vcc2=3.3V, can also be applied to the present embodiment.

Figure 10:
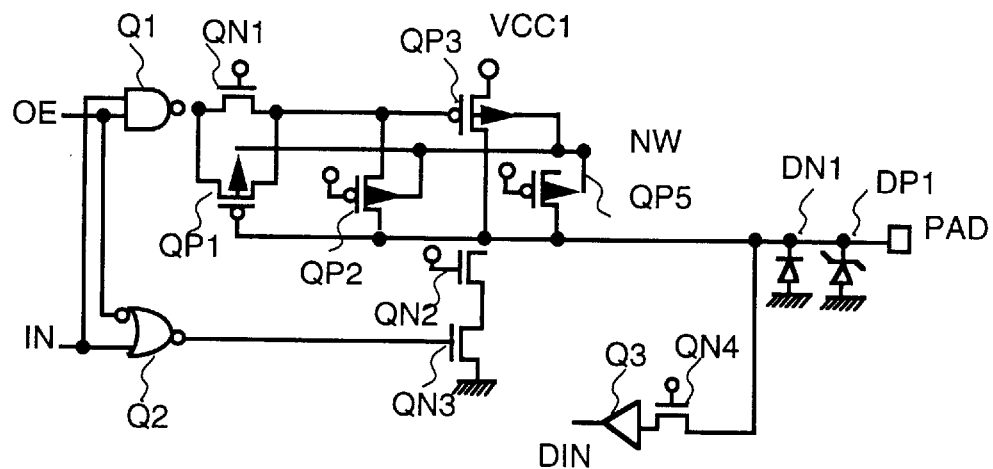
FIG. 10 is a schematic circuit diagram of a further embodiment of input and output buffer circuits according to the present invention.

FIG. 10 shows a further embodiment according to the present invention. The elements which perform the same functions and operations as the elements in the FIG. 2 embodiment are designated by the same reference numerals, and only the differences in the FIG. 10 embodiment from the FIG. 2 embodiment will be explained. In the present embodiment, the potential control of the N well node NW of the driver PMOS transistor QP3 is performed by the PMOS transistor QP5. Namely, only when the PAD potential≧Vcc1+Vth will the PMOS transistor QP5 be turned on to equate the potential of the N well node NW with that at the PAD terminal, and when the potential of the PAD terminal is other than in the above range, the PMOS transistor QP5 is turned off to place the potential of the N well node NW in a floating state, whereby the current path which may be produced through a parasitic diode in the driver PMOS transistor QP3 is prevented. The modifications of the devices for countermeasuring electrostatic destruction, as explained in connection with FIG. 4 and FIG. 5, the pulling up of the "H" level potential by means of the PMOS transistor QP9, as explained in connection with FIG. 6, and the idea of lowering the power source voltages, for example, down to Vcc1=2.5 and Vcc2=3.3V, can also be applied to the present embodiment.

Figure 11:
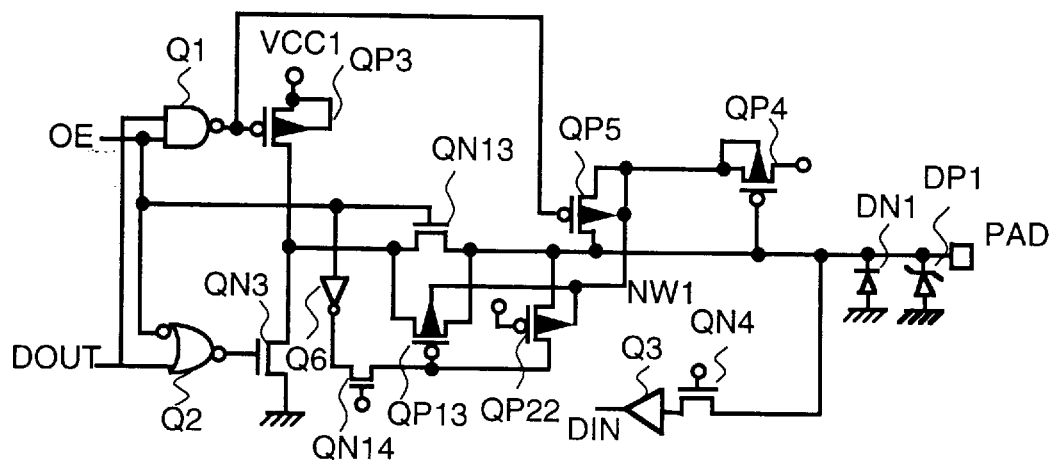
FIG. 11 is a schematic circuit diagram of a still further embodiment of input and output buffer circuits according to the present invention.

FIG. 11 shows a further embodiment according to the present invention. The elements which perform the same functions and operations as the elements in the FIG. 2 embodiment are designated by the same reference numerals, and only the differences in the FIG. 11 embodiment from the FIG. 2 embodiment will be explained. In the present embodiment, a NMOS transistor QN13 and a PMOS transistor QP13 are introduced between the driver MOS transistors QP3 and QN3 and the PAD terminal so as to function as a MOS transistor switch and to prevent the higher potential of 5.0V at the PAD terminal from being applied onto the driver MOS transistors QP3 and QN3. The MOS transistor switch operates in such a manner that during the output mode of OE="H" the MOS transistors QP13 and QN13 are turned on so as to be conductive, and during the input mode the MOS transistors QP13 and QN13 are turned off so as to be nonconductive. An inverter Q6 is provided for producing a signal which is the inverted form of the signal OE, a PMOS transistor QP22 is introduced to apply the same potential of 5.5V at the gate of the MOS transistor switch QP13 when the potential of the PAD terminal is at 5.5V and thereby to prevent the formation of a current path through the MOS transistor switch QP13, and the NMOS transistor QN14 serves as an element which prevents the higher potential of 5.0V appearing at the gate of the MOS transistor switch QP13 from being applied at the output of the inverter Q6. The modifications of the devices for countermeasuring electrostatic destruction, as explained in connection with FIG. 4 and FIG. 5, the pulling up of the "H" level potential by means of the PMOS transistor QP9, as explained in connection with FIG. 6, and the idea of lowering the power source voltages, for example, down to Vcc1=2.5 and Vcc2= 3.3V, can also be applied to the present embodiment.

Figure 12:
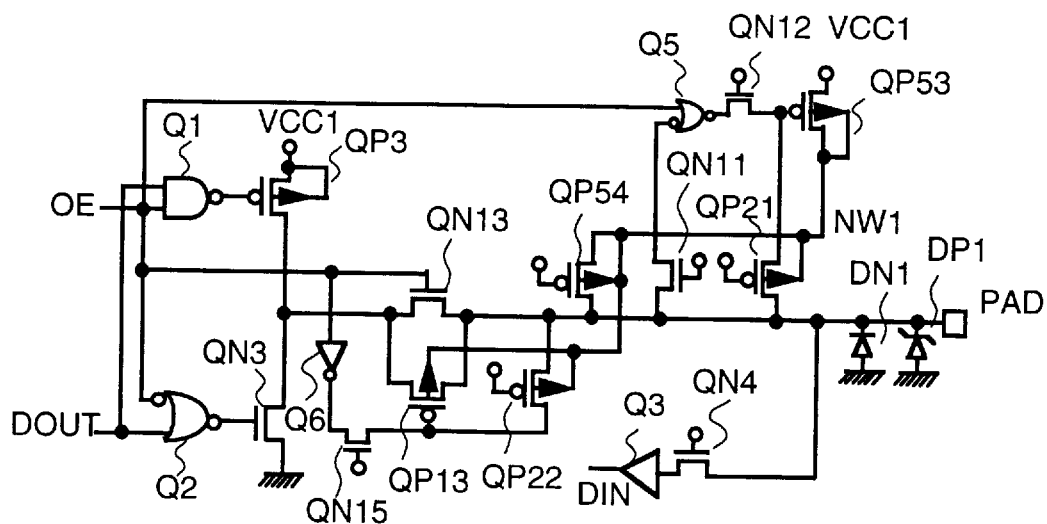
FIG. 12 is a schematic circuit diagram of a still further embodiment of input and output buffer circuits according to the present invention.

FIG. 12 shows a further embodiment according to the present invention. the elements which perform the same functions and operations as the elements in the FIG. 11 embodiment are designated by the same reference numerals, and only the differences in the FIG. 12 embodiment from the FIG. 11 embodiment will be explained. In the present embodiment, the potential control of applying Vcc1 to the N well node NW1 of the PMOS transistor QP53 is performed by the PMOS transistor QP53. The controlling operation of the PMOS transistor QP53 is equivalent to that of the PMOS transistor QP4 in FIG. 11, in that, during the output mode of OE="H" or when PAD potential is "L", the PMOS transistor QP53 is designed to be turned on. The modifications of the devices for countermeasuring electrostatic destruction, as explained in connection with FIG. 4 and FIG. 5, the pulling up of the "H" level potential by means of the PMOS transistor QP9, as explained in connection with FIG. 6, and the idea of lowering the power source voltages, for example, down to Vcc1=2.5 and Vcc2=3.3V, can also be applied to the present embodiment.

Figure 13:
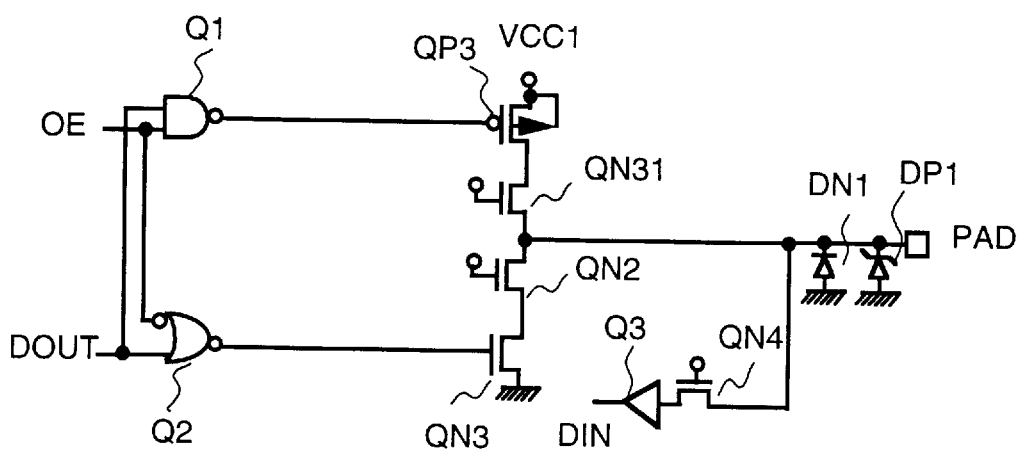
FIG. 13 is a schematic circuit diagram of a still further embodiment of input and output buffer circuits according to the present invention.

FIG. 13 shows a further embodiment according to the present invention. The elements which perform the same functions and operations as the elements in the FIG. 2 embodiment are designated by the same reference numerals, and only the differences in the FIG. 13 embodiment from the FIG. 2 embodiment will be explained. In the present embodiment, a NMOS transistor QN31 is connected in series with the driver PMOS transistor QP3 so as to prevent the higher potential of 5.0V possibly appearing at the PAD terminal from being applied to the driver PMOS transistor QP3. The NMOS transistor likely functions to prevent the higher potential of 5.0V possibly appearing at the PAD terminal from being applied to the driver NMOS transistor QN3. The modifications of the devices for countermeasuring electrostatic destruction, as explained in connection with FIG. 4 and FIG. 5, the pulling up of the "H" level potential by means of the PMOS transistor QP9, as explained in connection with FIG. 6, and the idea of lowering the power source voltages, for example, down to Vcc1=2.5 and Vcc2=3.3V, can also be applied to the present embodiment.

Figure 14:
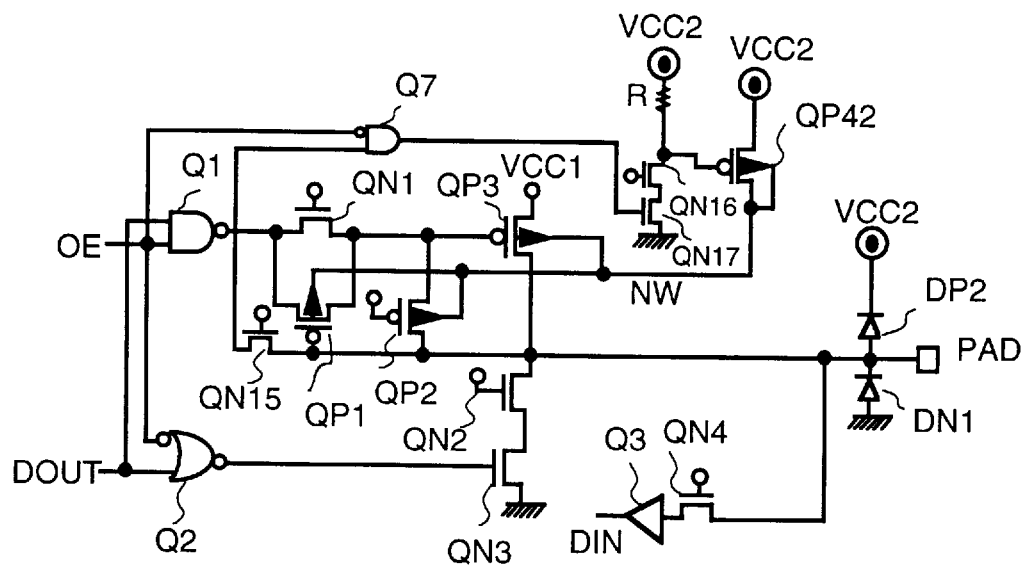
FIG. 14 is a schematic circuit diagram of a still further embodiment of input and output buffer circuits according to the present invention.
Figure 17:
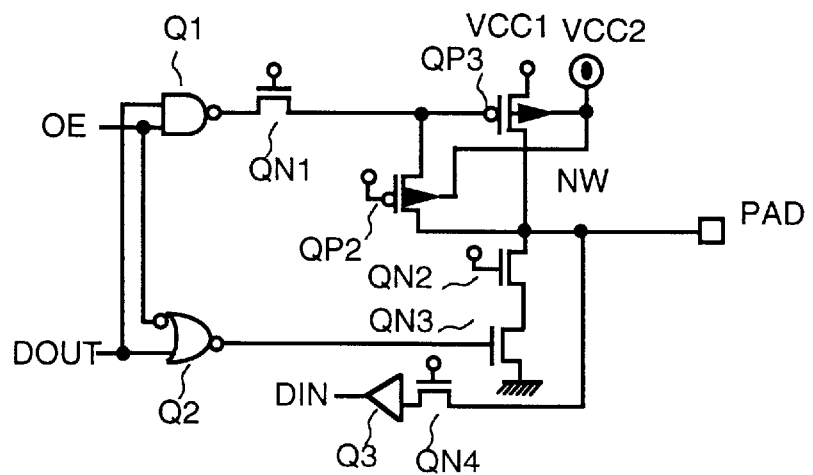
FIG. 17 is a schematic circuit diagram of another prior art input and output buffer circuit of a type similar to the present invention.
Figure 18:
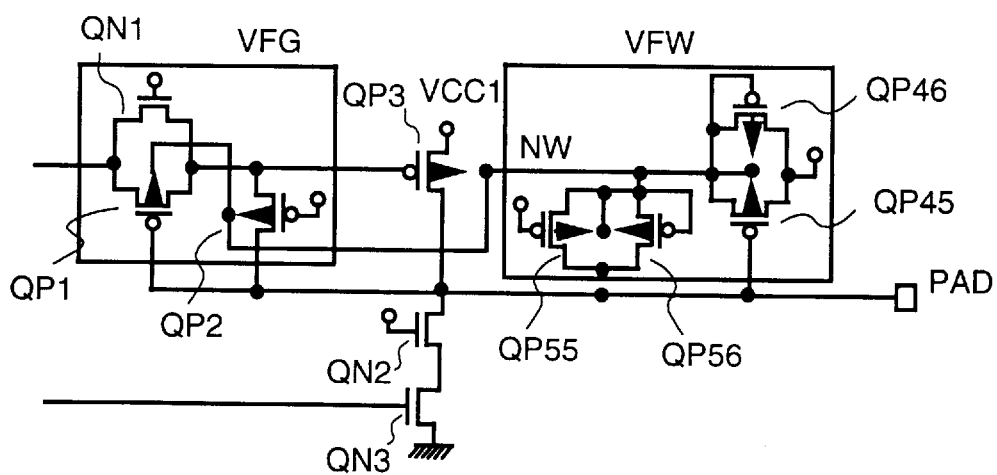
FIG. 18 is a schematic circuit diagram of still another prior art input and output buffer circuit of a type similar to the present invention.

FIG. 14 shows an improvement of the FIG. 17 prior art circuit in which the excess voltage withstanding capacity of the driver PMOS transistor is ensured by increasing the thickness of the metal oxide film during the manufacture thereof. In the FIG. 14 embodiment, the excess voltage withstanding capacity is ensured by a circuit structure, in that, the FIG. 14 embodiment is one of modifications of the FIG. 9 embodiment and uses two power sources of different voltage levels. The elements which perform the same functions and operations as the elements in the FIG. 9 embodiment are designated by the same reference numerals, and only the differences in the FIG. 14 embodiment from the FIG. 9 embodiment will be explained. In the present embodiment, when the PAD potential is at the higher potential of 5.0V in the input mode, one of the potentials Vcc2 among two power source potentials is applied to the N well node NW of the driver PMOS transistor QP3, whereby an excess voltage application to the driver PMOS transistor QP3 and the formation of a current path therethrough are prevented. Namely, when the PAD potential is at "H"=5.0V in the input mode, the two inputs at a two input NAND circuit Q7 are respectively OE="L" and Vcc1−Vth="H", and the two input NAND circuit Q7 outputs a "H" level signal to turn on the NMOS transistor QN17. Thereby, a "L" level signal is inputted to the gate of a PMOS transistor QP42 to turn it on and to apply Vcc2 of 5.0V to the N well node NW of the driver PMOS transistor QP3. A resistor R in the present embodiment functions as a voltage divider together with the NMOS transistors QN16 and QN17 and pulls up the "L" level signal of 0V which is applied to the gate of the PMOS transistor QP42 when the NMOS transistor QN17 is turned on to thereby prevent the higher voltage of 5.0V from being applied between the gate and the N well node NW side of the PMOS transistor QP42. The NMOS transistor QN16 is also used for protecting the NMOS transistor QN17 from being subjected to the higher voltage of Vcc2, and the NMOS transistor QN15 is used for protecting the two input NAND circuit Q7 from being subjected to the higher potential 5.0V at the PAD. Namely, the potential of the N well node NW of the driver PMOS transistor QP3 is rendered to Vcc2 of 5.0V through the turning on of the PMOS transistor QP42 when the PAD potential is "H"=5.0V in the input mode, and under the other conditions, when the PAD potential is at "L" and when OE="L" in the output mode, Vcc2="H" is applied to the gate of the PMOS transistor QP42 to turn off the same and to place the potential of the N well node NW of the driver PMOS transistor QP3 into a floating state. The modifications of the devices for countermeasuring electrostatic destruction, as explained in connection with FIG. 4 and FIG. 5, the pulling up of the "H" level potential by means of the PMOS transistor QP9, as explained in connection with FIG. 6, and the idea of lowering the power source voltages, for example, down to Vcc1=2.5 and Vcc2=3.3V, can also be applied to the present embodiment.

Figure 15:
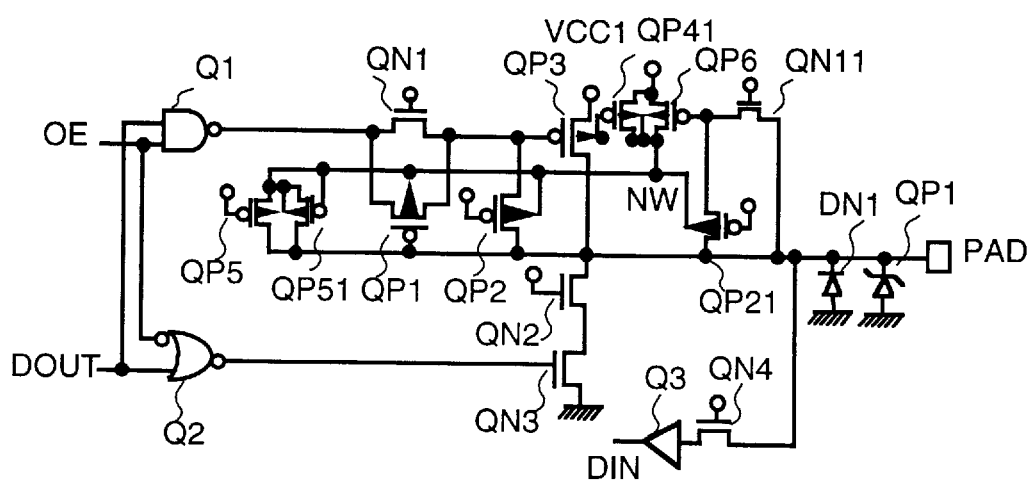
FIG. 15 is a schematic circuit diagram of a still further embodiment of input and output buffer circuits according to the present invention.
Figure 16:
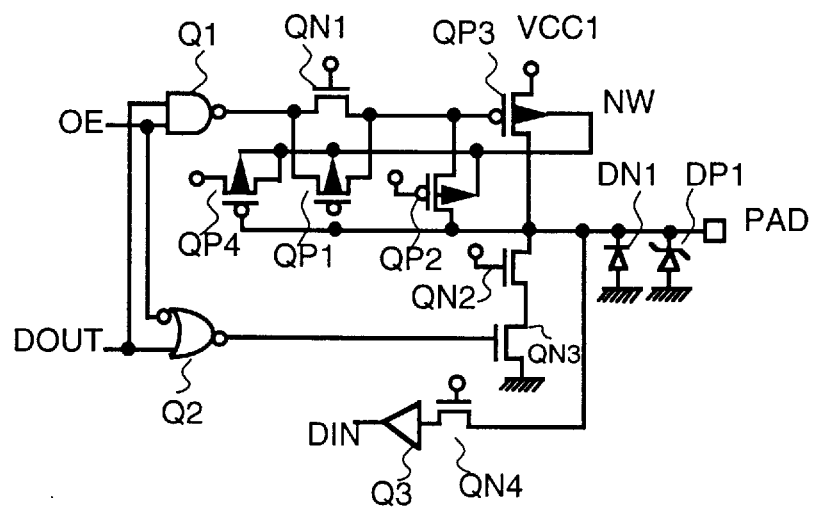
FIG. 16 is a schematic circuit diagram of one prior art input and output buffer circuit of a type similar to the present invention.

FIG. 15 shows a further embodiment according to the present invention. The elements which perform the same functions and operations as the elements in the FIG. 2 embodiment are designated by the same reference numerals, and only the differences in the FIG. 15 embodiment from the FIG. 2 embodiment will be explained. In the present embodiment, when the PAD terminal potential≦Vcc1−Vth, the PMOS transistor QP6 is turned on by the signal from the PAD via the NMOS transistor QN11 to apply Vcc1 onto the N well node NW of the driver PMOS transistor QP3. Further, regardless of the output mode and the input mode, when the PAD terminal potential is at the normal value of Vcc1, the potential at the source side of the NMOS transistor QN11 is rendered to Vcc1−$V_{thQN11}$, and when the threshold voltage $V_{thQN11}$ of the NMOS transistor QN11 is larger than the threshold voltage $V_{thQP6}$ of the PMOS transistor QP6, the PMOS transistor QP6 is turned on and Vcc1 is applied to the N well node NW of the driver PMOS transistor QP3. However, even when dropping down from 5.0V in the input mode to 3.3V, Vcc1 cannot be applied to the N well node NW of the driver PMOS transistor QP3 because the potential at the gate of the driver PMOS transistor QP3 cannot be pulled down from Vcc1+Vth to Vcc1=Vth. In the present embodiment, the clamping PMOS transistors QP51 and QP41 may be eliminated. Still further, a circuit arrangement which applies the potential of Vcc1 to the N well node NW of the driver PMOS transistor QP3 by means of an OE signal during the output mode may be added. The modifications of the devices for countermeasuring electrostatic destruction, as explained in connection with FIG. 4 and FIG. 5, the pulling up of the "H" level potential by means of the PMOS transistor QP9, as explained in connection with FIG. 6, and the idea of lowering the power source voltages, for example, down to Vcc1=2.5 and Vcc2=3.3V, can also be applied to the present embodiment.

According to the present invention, in an I/O buffer circuit through which other circuits, each operating with different power sources having different voltage levels, are permitted to be connected to each other while preventing formation of a path for current through a driver PMOS transistor contained therein, an I/O buffer circuit which shows a desired noise resistance and a desired latch-up resistance and prevents the reduction of the drain driving current of the driver PMOS transistor is realized.

We claim:

1. An input and output buffer circuit which is contained in a first circuit operated on a first power source of a first voltage level Vcc1 and is adapted to connect to a second circuit operated on a second power source of a second voltage level Vcc2, higher than the first voltage level Vcc1, comprising:

a driver PMOS transistor with a CMOS gate and having an N well;

a PAD terminal serving as an input and output terminal;

means for controlling the potential of the N well of said driver PMOS transistor in such a manner that, when the potential at said PAD terminal is less than Vcc1−Vth, wherein Vth is a threshold voltage of a MOS transistor contained between said driver PMOS transistor and said PAD terminal, the potential of the N well is set at the first voltage level Vcc1, when the potential at said PAD terminal is more than the potential Vcc1+Vth, the potential of the N well is made equal to the potential at said PAD terminal, and when the input and output buffer circuit is in an output mode, the potential of the N well is switched to the first voltage level Vcc1; and an input and output control circuit, and wherein said N well potential control means includes a first PMOS transistor having a source which is connected to the first power source of the first voltage level Vcc1, a gate which is connected to said PAD terminal, a drain which is connected to the N well and a N type substrate which is connected to the N well; a second PMOS transistor having a source which is connected to said PAD terminal, a drain which is connected to the N well, a gate which is connected to the first power source of the first voltage level Vcc1 and a N type substrate which is connected to the N well; a third PMOS transistor having a source which is connected to the first power source of the first voltage level Vcc1, a drain which is connected to the N well, a gate which is coupled to said input and output control circuit and a N type substrate which is connected to the N well; and a fourth PMOS transistor having a source which is connected to said PAD terminal, a gate which is connected to the first power source of the first voltage level Vcc1, a drain which is connected to the gate of said third PMOS transistor and a N type substrate which is connected to the N well.

2. An input and output buffer circuit according to claim 1, wherein said N well potential control means further includes fifth and sixth PMOS transistors connected respectively in parallel with said first and second PMOS transistors for clamping the potential of the N well above a predetermined clamping level during a floating state thereof.

3. An input and output buffer circuit according to claim 1, further comprising an element connected to said PAD terminal which serves to protect the input and output buffer circuit against electrostatic destruction, said element being constituted by a punch through type diode.

4. An input and output buffer circuit according to claim 1, further comprising an element connected to said PAD terminal which serves to protect the input and output buffer circuit against electrostatic destruction, said element being constituted by a plurality of serially connected devices, said devices being one of PN junction type diodes and PMOS transistors, and one end of said element being connected to the first power source of the first voltage level Vcc1.

5. An input and output buffer circuit according to claim 1, further comprising an element connected to said PAD terminal which serves to protect the input and output buffer circuit against electrostatic destruction, said element being constituted by one of a PN junction type diode and a PMOS transistor, of which one end is connected to the second power source of the second voltage level Vcc2.

6. An input and output buffer circuit according to claim 1, further comprising an input circuit, said input circuit including a feedback type pull up circuit constituted by a source and drain path of a NMOS transistor.

7. An input and output buffer circuit which is contained in a first circuit operated on a first power source of a first voltage level Vcc1 and is adapted to connect to a second circuit operated on a second power source of a second voltage level Vcc2, higher than the first voltage level Vcc1, comprising:

a driver PMOS transistor with a CMOS gate and having an N well;

a PAD terminal serving as an input and output terminal;

means for controlling the potential of the N well of said driver PMOS transistor in such a manner that, when the potential at said PAD terminal is less than Vcc1−Vth, wherein Vth is a threshold voltage of a MOS transistor contained between said driver PMOS transistor and said PAD terminal, the potential of the N well is set at the first voltage level Vcc1, when the potential at said PAD terminal is more than the potential Vcc1+Vth, the potential of the N well is made equal to the potential at said PAD terminal, and when the input and output buffer circuit is in an output mode, the potential of the N well is switched to the first voltage level Vcc1; and an input and output control circuit, and wherein said N well potential control means includes a first PMOS transistor having a source which is connected to said PAD terminal, a drain which is connected to the N well, a gate which is connected to the first power source of the first voltage level Vcc1 and a N type substrate which is connected to the N well; a second PMOS transistor having a source which is connected to the first power source of the first voltage level Vcc1, a drain which is connected to the N well, a gate which is coupled to said input and output control circuit and a N type substrate which is connected to the N well; and a third PMOS transistor having a source which is connected to said PAD terminal, a gate which is connected to the first power source of the first voltage level Vcc1, a drain which is connected to the gate of said second PMOS transistor and a N type substrate which is connected to the N well.

8. An input and output buffer circuit according to claim 7, further comprising an element connected to said PAD terminal which serves to protect the input and output buffer circuit against electrostatic destruction, said element being constituted by a punch through type diode.

9. An input and output buffer circuit according to claim 7, further comprising an element connected to said PAD terminal which serves to protect the input and output buffer circuit against electrostatic destruction, said element being constituted by a plurality of serially connected devices, said devices being one of PN junction type diodes and PMOS transistors, and one end of said element being connected to the first power source of the first voltage level Vcc1.

10. An input and output buffer circuit according to claim 7, further comprising an element connected to said PAD terminal which serves to protect the input and output buffer circuit against electrostatic destruction, said element being constituted by one of a PN junction type diode and a PMOS transistor, of which one end is connected to the second power source of the second voltage level Vcc2.

11. An input and output buffer circuit according to claim 7, further comprising an input circuit, said input circuit including a feedback type pull up circuit constituted by a source and drain path of a NMOS transistor.

* * * * *